(12) United States Patent
Xu et al.

(10) Patent No.: US 9,402,328 B2
(45) Date of Patent: *Jul. 26, 2016

(54) SERVER

(71) Applicants: INVENTEC (PUDONG) TECHNOLOGY CORPORATION, Shanghai (CN); INVENTEC CORPORATION, Taipei (TW)

(72) Inventors: Ji-Peng Xu, Shanghai (CN); Yu-Long Shen, Shanghai (CN); Ming-Gang Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 180 days.

This patent is subject to a terminal disclaimer.

(21) Appl. No.: 14/489,779

(22) Filed: Sep. 18, 2014

(65) Prior Publication Data
US 2016/0044820 A1    Feb. 11, 2016

(30) Foreign Application Priority Data
Aug. 8, 2014    (CN) .......................... 2014 1 0389167

(51) Int. Cl.
*G06F 1/20*    (2006.01)
*H05K 5/00*    (2006.01)
*H05K 7/16*    (2006.01)
*H05K 7/14*    (2006.01)
*H05K 7/20*    (2006.01)

(52) U.S. Cl.
CPC .......... *H05K 7/1487* (2013.01); *H05K 7/20727* (2013.01)

(58) Field of Classification Search
CPC . H05K 7/1487; H05K 7/1429; H05K 7/1422; H05K 7/20727; G06F 1/184

USPC ........ 361/679.46, 679.48, 724, 727, 736, 741
See application file for complete search history.

(56) References Cited

U.S. PATENT DOCUMENTS

| | | | | |
|---|---|---|---|---|
| 7,839,624 B2* | 11/2010 | Lin | .......................... | G06F 1/184 361/679.02 |
| 7,894,195 B2* | 2/2011 | Lin | .......................... | G06F 1/184 361/727 |
| 8,711,569 B2* | 4/2014 | Yi | .......................... | H05K 7/1487 361/730 |
| 9,179,572 B2* | 11/2015 | Li | .......................... | H05K 7/1487 |
| 2010/0027214 A1* | 2/2010 | Wu | .......................... | G06F 1/184 361/679.47 |
| 2010/0271766 A1* | 10/2010 | Lin | ...................... | H05K 7/1487 361/679.02 |
| 2011/0116226 A1* | 5/2011 | Yang | ..................... | H05K 7/1487 361/679.48 |
| 2012/0057317 A1* | 3/2012 | Lin | .......................... | G06F 1/184 361/753 |

(Continued)

*Primary Examiner* — Nidhi Thaker
(74) *Attorney, Agent, or Firm* — Huffman Law Group, PC

(57) ABSTRACT

A server includes a case, a storage module, a connection module, a first expander board, a second expander board, a first mother board and a second mother board. The case includes a bottom case. The storage module is disposed on the bottom case and includes multiple storage units. The connection module is disposed on the bottom case and connected to the storage module. At least one first expander chip is disposed on the first expander board. At least one second expander chip is disposed on the second expander board. At least one first central processing unit is disposed on the first mother board. At least one second central processing unit is disposed on the second mother board. The first expander board, the second expander board, the first mother board and the second mother board are pluggably connected to the connection module, respectively.

12 Claims, 11 Drawing Sheets

(56) References Cited

U.S. PATENT DOCUMENTS

2013/0155600 A1* 6/2013 Ross .................... H05K 7/1487
361/679.31
2015/0241945 A1* 8/2015 Dube .................... G06F 1/3234
713/320

* cited by examiner

SERVER

CROSS-REFERENCE TO RELATED APPLICATIONS

This non-provisional application claims priority under 35 U.S.C. §119(a) on Patent Application No(s). 201410389167.1 filed in China on Aug. 8, 2014, the entire contents of which are hereby incorporated by reference.

BACKGROUND

1. Technical Field

The disclosure relates to a server. More particularly, the disclosure relates to a server with a plurality of expander boards which are pluggable.

2. Related Art

In recent years, developments of the Internet have accelerated the speeds of information transmissions. Nowadays, Cloud Technology has become a mainstream method for information transmissions; it has changed the ways of information transmissions and makes information become richer.

Generally speaking, the "cloud" of the Cloud Technology means a cluster of servers on the Internet. When a command generated by a client computer is transmitted to the cloud, the cluster of servers having a huge number of computers will process the command remotely, to provide information backward to the client computer. Additionally, all commands are processed by the huge number of computers with the cluster of servers.

However, with the developments of the smart phones, tablet computers and smart TVs, the needs of information demands, processes and transmissions are increased. Accordingly, the needs of the servers with multifunction (such as data saving or data processing) are also increased.

Currently, the servers may comprise a plurality of mother boards. Each mother board is assembled with a central processing unit or other expander elements such as Peripheral Component Interface Express (PCIe) cards, memories or hard disks. Moreover, each mother board may be fixed to an expander board which is assembled with the expander elements, respectively. However, in prior art, each mother board is connected to the expander board respectively and independently. When any mother board or expander board shall be replaced (for example, when each mother board or expander board is failed), a user has to disassemble each mother board or expander board at the same time for repair. Additionally, it is inconvenient to assemble and disassemble the mother boards from the servers in prior art.

Furthermore, when the user wants to replace the mother boards or the expander boards, he/she has to shut down the servers. If the servers are shut down too many times, the stabilities and the reliabilities of the servers will be decreased and it wastes too much time.

SUMMARY

The disclosure provides a server, which is pluggably connected to a plurality of mother boards and a plurality of expander boards, for saving the time of assembling and disassembling.

The disclosure provides a server which comprises a case, a storage module, a connection module, a first expander board, a second expander board, a first mother board and a second mother board. The case comprises a bottom case. The storage module is disposed on the bottom case and comprises a plurality of storage units. The connection module is disposed on the bottom case and connected to the storage module. At least one first expander chip is disposed on the first expander board. At least one second expander chip is disposed on the second expander board. At least one first central processing unit is disposed on the first mother board. At least one second central processing unit is disposed on the second mother board. The first expander board, the second expander board, the first mother board and the second mother board are pluggably connected to the connection module, respectively.

In some embodiment of the disclosure, the connection module has a first side and a second side which are opposite to each other. The storage module is connected to the first side of the connection module. The first expander board, the second expander board, the first mother board and the second mother board are connected to the second side of the connection module, respectively.

In some embodiment of the disclosure, the storage module comprises a back board disposed between the connection module and the storage units. Additionally, the back board is connected to the connection module and the storage units. The storage module is coupled to the connection module via the back board.

In some embodiment of the disclosure, the connection module comprises a first connecting board and a second connecting board which are connected to each other. The first connecting board is located between the second connecting board and the bottom case. Additionally, the first connecting board comprises a first set of connection ports, a second set of connection ports and a third set of connection ports. The first set of connection ports is located at the first side and the second set of connection ports is located at the second side. The third set of connection ports faces toward the second connecting board. The first set of connection ports is connected and electrically coupled to the storage module. The second set of connection ports is electrically coupled to the first set of connection ports, for being connected to the first expander board, the second expander board, the first mother board or the second mother board, so as to access data. The third set of connection ports is electrically coupled to the first set of connection ports and the second set of connection ports, for being connected to the second connecting board. Furthermore, the second connecting board comprises a fourth set of connection ports and a fifth set of connection ports. The fourth set of connection ports is electrically coupled to the first connecting board via the third set of connection ports. The fifth set of connection ports is coupled to the fourth set of connection ports, for being connected to the first mother board, the second mother board, the first expander board or the second expander board, so as to access data.

In some embodiment of the disclosure, the connection module further comprises a tray disposed on the bottom case. The tray comprises a plurality of fixing posts. The first connecting board comprises a plurality of key-shaped holes and a plurality of positioning holes. The first connecting board is assembled with the tray by connections of the plurality of key-shaped holes and the fixing posts and connections of the positioning holes and the other fixing posts.

In some embodiment of the disclosure, the server further comprises a fan module disposed between the storage module and the first expander board, the second expander board, the first mother board, the second mother board. The fan module comprises a main frame, a bottom frame, two side frames and at least one mounting frame, the bottom frame and the two side frame are connected to three ends of the main frame respectively and extend toward the first expander board, the second expander board, the first mother board and the second mother board respectively, the mounting frame connected to the main frame extends toward the storage module, and the mounting frame is adapted to accommodate at least one pluggable fan.

In some embodiment of the disclosure, the second connecting board is disposed on the bottom frame. The bottom frame has at least one slot. The fourth set of connection ports of the second connecting board is connected to the third set of connection ports through the slot and electrically coupled to the first connecting board.

In some embodiment of the disclosure, the case further comprises two lateral cases, and the two side frames are fixed to the two lateral cases by at least one fixing component, respectively.

In some embodiment of the disclosure, the server further comprises a power module. The power module is disposed next to the first expander board and the first mother board, or disposed next to the second expander board and the second mother board. The power module is connected to the connection module.

In some embodiment of the disclosure, the first expander board comprises a first main expander board and a first auxiliary expander board. The first main expander board is coupled to the connection module and the first auxiliary expander board. The second expander board comprises a second main expander board and a second auxiliary expander board. The second main expander board is coupled to the connection module and the second auxiliary expander board.

In some embodiment of the disclosure, the case comprises a plurality of partitions erected on the bottom case. Each partition has two straight tracks with heights which are different from each other. The first expander board, the second expander board, the first mother board and the second mother board are capable of being guided by the plurality of straight tracks of the plurality of partitions so as to be connected to the connection module pluggably.

In some embodiment of the disclosure, the storage module is coupled to the first expander board, the second expander board, the first mother board and the second mother board via the connection module. When either the first expander board or the second expander board operates in a normal state and either the first mother board or the second mother board operates in the normal state, either the first mother board or the second mother board is adapted to access the data from all the plurality of storage units of the storage module by a route of either the first expander board or the second expander board which operates in the normal state.

In some embodiment of the disclosure, the first mother board, the second mother board, the first expander board and the second expander board are disposed in the case independently. When the first mother board, the second mother board, the first expander board and the second expander board operate in a normal state, any one of the first mother board and the second mother board, or any one of the first expander board and the second expander board which operates in the normal state is capable of being replaced without shutting down the server.

To sum up, according to the server of the disclosure, the first expander board, the second expander board, the first mother board and the second mother board are pluggably connected to the connection module, thereby improving the efficiency of the assembly and disassembly, stability and reliability of the operation.

In some embodiments, when either the first expander board or the second expander board operates in a normal state and either the first mother board or the second mother board operates in the normal state, either the first mother board or the second mother board is adapted to access the data from the storage module by an route of either the first expander board or the second expander board which operates in the normal state. When the first mother board, the second mother board, the first expander board and the second expander board all operate in the normal state, any one of the first mother board and the second mother board, or any one of the first expander board and the second expander board which operates in the normal state is capable of being replaced without shutting down the server. Because the configurations of the first expander board and the second expander board, and the configurations of the first mother board and the second mother board become redundant designs mutually, when any mother board or the expander board fails, it may be replaced by other mother boards or expander boards without shutting down the server. Additionally, since the first mother board, the second mother board, the first expander board and the second expander board are pluggable, the server may be replaced without being shut down, thereby improving the efficiency of the assembly and disassembly, stability and reliability of the operation.

BRIEF DESCRIPTION OF THE DRAWINGS

The disclosure will become more fully understood from the detailed description given hereinbelow and the accompanying drawings which are given by way of illustration only and thus are not limitative of the disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The disclosure provides a server. The server comprises a plurality of mother boards and comprises a plurality of expander boards which are electrically coupled to each other and pluggably connected to the server. Additionally, the mother boards and the expander boards become redundant designs mutually, which means when any mother board or the expander board is failed, it may be replaced by other mother boards or expander boards without shutting down the server.

Figure 1:
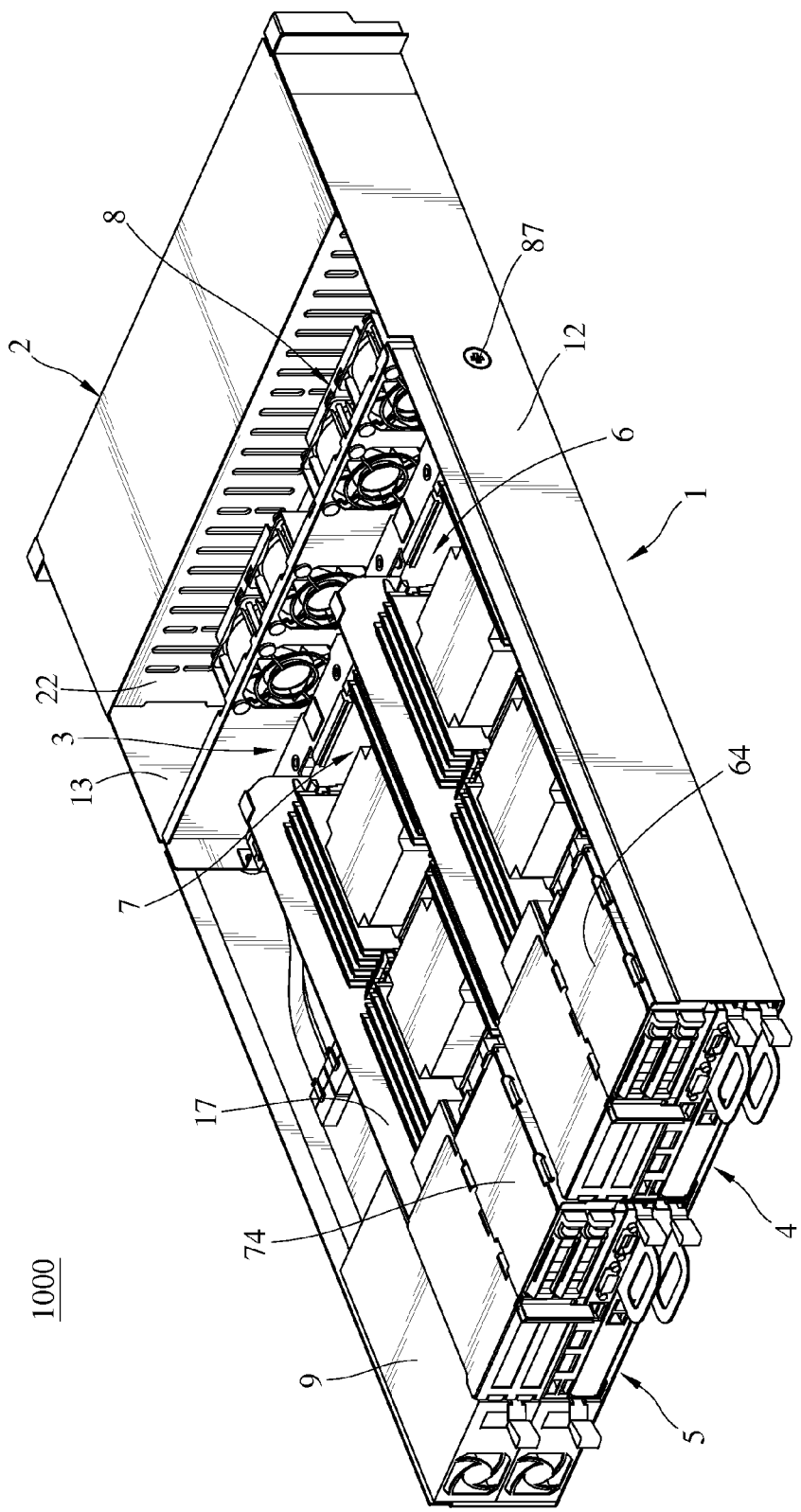
FIG. 1 is a perspective view of a server according to an embodiment of the disclosure.

The structure of the server will be described as follows. Please refer to FIG. 1, which is a perspective view of a server according to an embodiment of the disclosure. As shown in FIG. 1, the server 1000 comprises a case 1, a storage module 2, a connection module 3, a first expander board 4, a second expander board 5, a first mother board 6 and a second mother board 7. In this and some embodiments, the case 1 comprises an accommodating space. The storage module 2, the connection module 3, the first expander board 4, the second expander board 5, the first mother board 6 and the second mother board 7 are all disposed in the accommodating space of the case 1. In this and some embodiments, the server 1000 further comprises a fan module 8 and a power module 9. The fan module 8 and a power module 9 are also accommodated in the accommodating space of the case 1.

Figure 3:
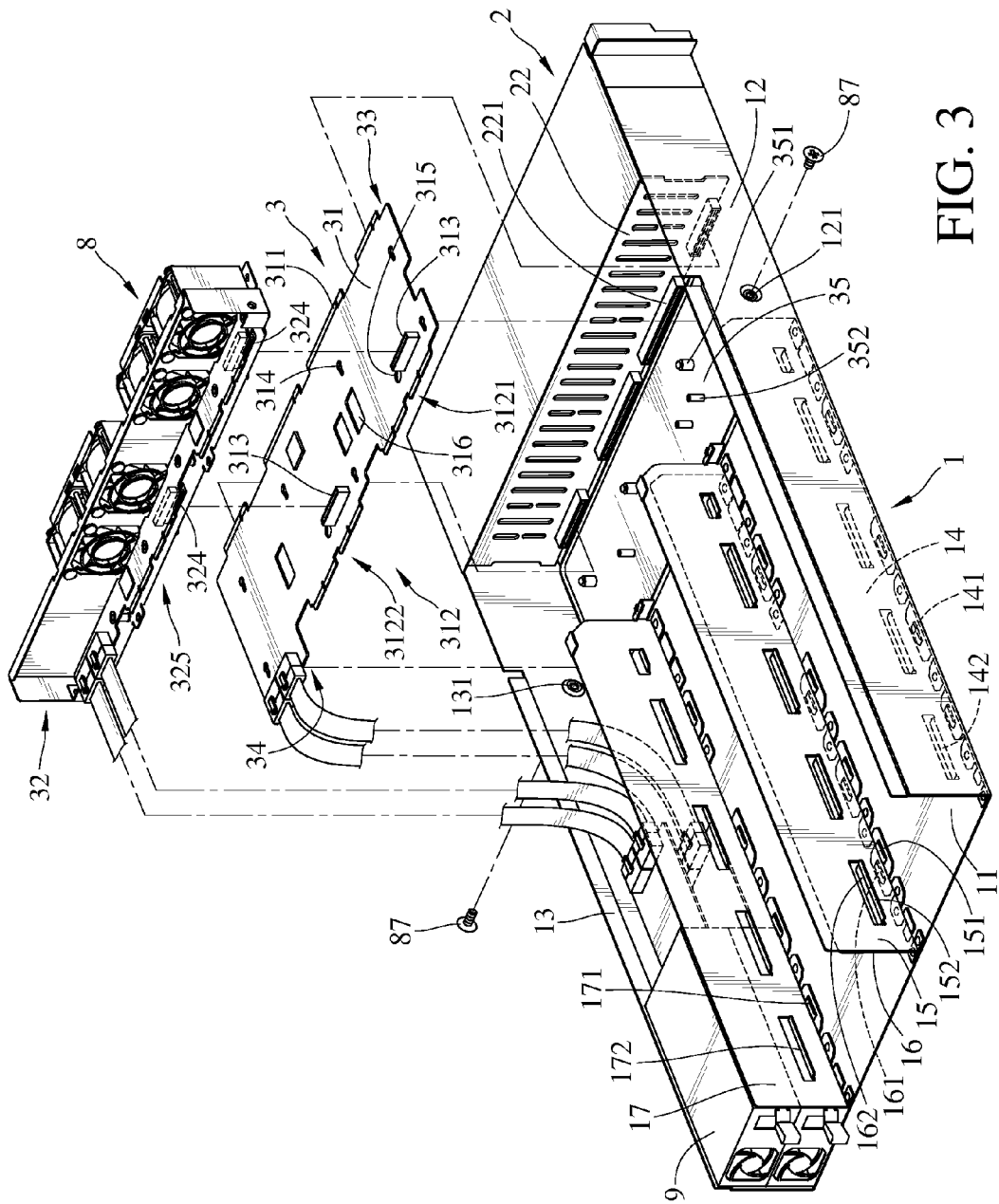
FIG. 3 is an exploded view of a case and a connection module according to the embodiment of the disclosure.
Figure 5:
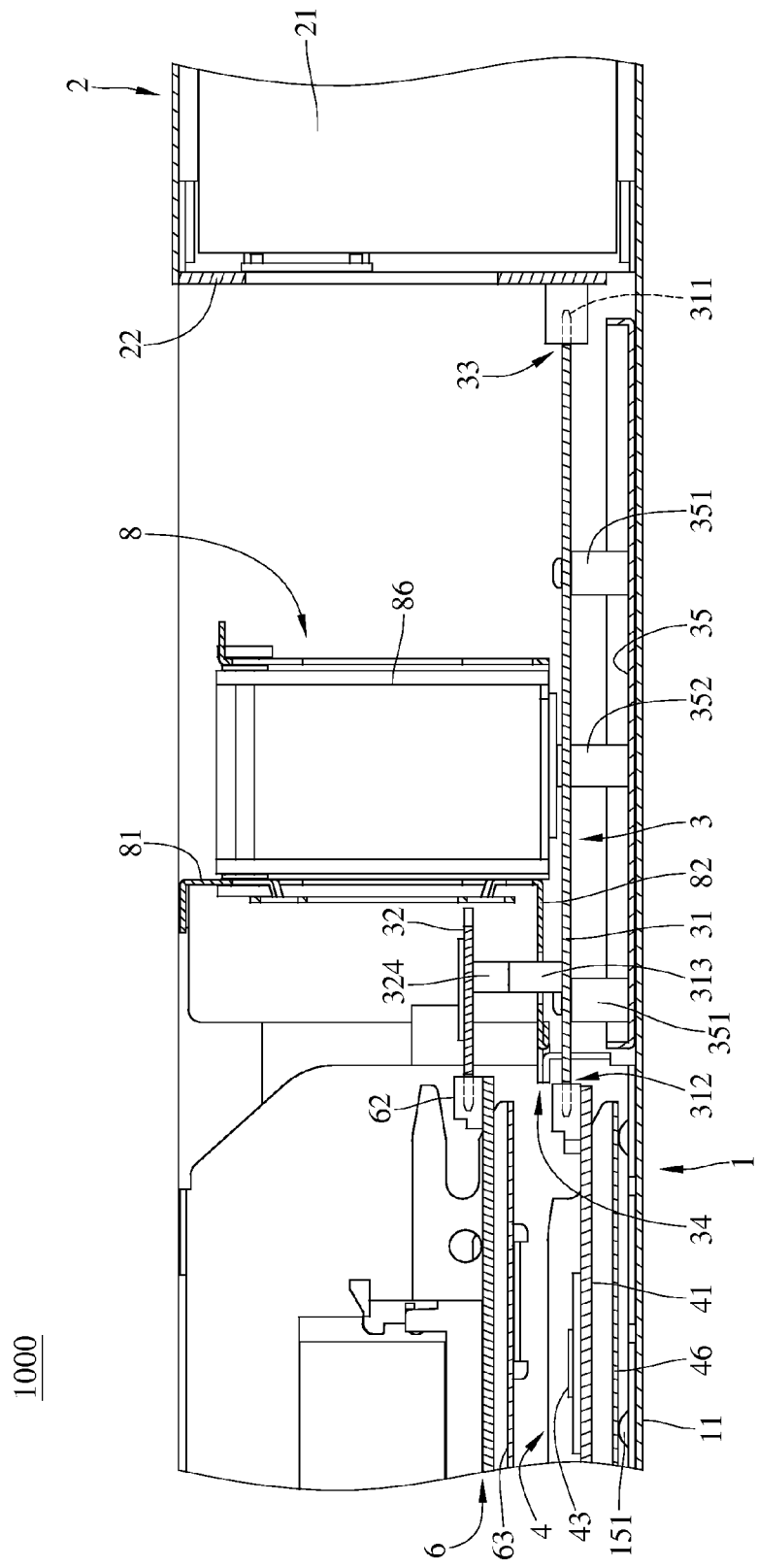
FIG. 5 is a side view of the server according to the embodiment in FIG. 1.

The configurations of each element of the server 1000 will be described as follows. Please refer to FIG. 1, FIG. 3 and FIG. 5. FIG. 3 is an exploded view of a case and a connection module according to an embodiment of the disclosure. FIG. 5 is a side view of the server according to the embodiment in FIG. 1.

The case 1 comprises a bottom case 11. In this and some embodiments, the storage module 2, the connection module 3, the first expander board 4, the second expander board 5 and the power module 9 are all disposed on the bottom case 11. The first expander board 4, the second expander board 5, the first mother board 6 and the second mother board 7 are pluggably connected to the connection module 3, respectively. Furthermore, the connection module 3 has a first side 33 and a second side 34 which are opposite to each other. The storage module 2 is connected to the first side 33 of the connection module 3. The first expander board 4, the second expander board 5, the first mother board 6 and the second mother board 7 are connected to the second side 34 of the connection module 3, respectively. Additionally, a fan module 8 is disposed on the connection module 3, and a power module 9 is connected to the second side 34 of the connection module 3. In other words, the first expander board 4, the second expander board 5, the first mother board 6, the second mother board 7 and the power module 9 are located at a front side of the case 1. The storage module 2 is located at a back side of the case 1. The connection module 3 and the fan module 8 are located between the front side and the back side of the case 1. Accordingly, the connection module 3 is adapted to be connected and transmit signals to each module of the server 1000.

In this and some embodiments, the case 1 further comprises two lateral cases 12 and 13 and four partitions 14, 15, 16 and 17. The lateral case 12 and the lateral case 13 are erected on two sides of the bottom case 11 oppositely and respectively, so as to form the accommodating space therein. The accommodating space has a first auxiliary accommodating space and a second auxiliary accommodating space. The first auxiliary accommodating space is formed between the partition 14 and the partition 15, for accommodating the first expander board 4 and the first mother board 6. The second auxiliary accommodating space is formed between the partition 16 and the partition 17, for accommodating the second expander board 5 and the second mother board 7. Furthermore, each partition 14, 15, 16 and 17 has two straight tracks 141, 142, 151, 152, 161, 162, 171 and 172 with heights which are different from each other. Accordingly, the first expander board 4, the second expander board 5, the first mother board 6 and the second mother board 7 are capable of being guided by the straight tracks 141, 142, 151, 152, 161, 162, 171 and 172 of the partitions 14, 15, 16 and 17, so as to be pluggably connected to the connection module 3. In this embodiment, the first mother board 6 is located on the first expander board 4 and a distance is formed between the first mother board 6 and the first expander board 4, so that the first mother board 6 and the first expander board 4 are not interfering with each other. Similarly, the second mother board 7 is located on the second expander board 5 and a distance is formed between the second mother board 7 and the second expander board 5, so that the second mother board 7 and the second expander board 5 are not interfering with each other. Accordingly, the first expander board 4, the second expander board 5, the first mother board 6 and the second mother board 7 are capable of being located at proper positions, respectively. The thicknesses of the first expander board 4 and the second expander board 5 are both equal to 0.5 U (1 U=1.75 in=44.45 mm). The thicknesses of the first mother board 6 and the second mother board 7 are both equal to 1.5 U. The differences between the thicknesses of the expander boards and the mother boards may prevent the expander board and the mother board from plugging at error positions. However, the heights of the expander boards may be, but not limited to, different from the heights of the mother boards. In other embodiments, the heights of the first expander board 4, the second expander board 5, the first mother board 6 and the second mother board 7 are all the same. In this embodiment, the power module 9 is disposed at a side next to the second expander board 5 and the second mother board 7. Another side next to the first mother board 6 and the first expander board 4 is opposite to the side which is next to the second expander board 5 and the second mother board 7. However, the disclosure is not limited by the relative positions of the first expander board 4, the second expander board 5, the first mother board 6, the second mother board 7 and the power module 9. In other embodiments, the first expander board 4 may be located on the first mother board 6, and the second expander board 5 may be located on the second mother board 7. Furthermore, the power module 9 may be located between the first expander board 4 and the second expander board 5. In other words, the power module 9 is disposed next to the first expander board 4 and the first mother board 6. Thus, the relative positions of the first expander board 4, the second expander board 5, the first mother board 6, the second mother board 7 and the power module 9 are adjustable according to the requirements.

The structure of the connection module 3 is described as follows. Please refer to FIG. 3 and FIG. 5 again. In this and some embodiments, the connection module 3 comprises a first connecting board 31 and a second connecting board 32 which are connected to each other. The first connecting board 31 is located between the second connecting board 32 and the bottom case 11. Additionally, the connection module 3 further comprises a tray 35 disposed on the bottom case 11. The tray 35 comprises a plurality of fixing posts 351. The first connecting board 31 comprises a plurality of key-shaped holes 314 and a plurality of positioning holes 315. The fixing posts 351 is connected to the first connecting board 31 through the key-shaped holes 314 and the positioning holes 315, so that the first connecting board 31 is assembled with the tray 35 by connections of the key-shaped holes 314 and the fixing posts 351, and by connections of the positioning holes 315 and the other fixing posts 351.

The first connecting board 31 comprises a first set of connection ports 311, a second set of connection ports 312 and a third set of connection ports 313. The first set of connection ports 311 is located at the first side 33 and the second set of connection ports 312 is located at the second side 34. The third set of connection ports 313 faces toward the second connecting board 32. The first set of connection ports 311 is connected and electrically coupled to the storage module 2. The second set of connection ports 312 is electrically coupled to the first set of connection ports 311, for being connected to the first expander board 4 or the second expander board 5 so as to access data. The third set of connection ports 313 is electrically coupled to the first set of connection ports 311 and the second set of connection ports 312, for being connected to the second connecting board 32. Furthermore, the second set of connection ports 312 comprises a first expander board connection port 3121 and a second expander board connection port 3122. The first expander board connection port 3121 is adapted to be connected to the first expander board 4, and the second expander board connection port 3122 is adapted to be connected to the second expander board 5. The second connecting board 32 comprises a fourth set of connection ports 324 and a fifth set of connection ports 325. The fourth set of connection ports 324 is electrically coupled to the first connecting board 31 via the third set of connection ports 313. The fifth set of connection ports is coupled to the fourth set of connection ports, for being connected to the first mother board 6 and the second mother board 7 so as to access data.

In other embodiments, when the first expander board 4 is located on the first mother board 6 and the second expander board 5 is located on the second mother board 7, the second set of connection ports 312 is electrically connected to the first mother board 6 and the second mother board 7. In this embodiment, the fifth set of connection ports 325 is electrically connected to the first expander board 4 and the second expander board 5. Accordingly, the first connecting board 31 and the second connecting board 32 are connected to the third set of connection ports 313 and the fourth set of connection ports 324 by board-to-board manner, so that the server 1000 does not need signal transmission cables and the structure of the server 1000 may be simplified.

In some embodiments of the disclosure, the server 1000 further comprises a fan module 8 disposed between the storage module 2, the first expander board 4, the second expander board 5, the first mother board 6 and the second mother board 7. The fan module 8 comprises a main frame 81, a bottom frame 82, two side frames 83 and 84, at least one mounting frame 85, and at least one pluggable fan 86. The bottom frame 82 and the two side frames 83 and 84 are connected to three ends of the main frame 81 respectively, and extend toward the first expander board 4, the second expander board 5, the first mother board 6 and the second mother board 7, respectively. The mounting frame 85 is connected to the main frame 81 and extends toward the storage module 2. The mounting frame 85 may be adapted to accommodate the pluggable fan 86. Additionally, the side frames 83 and 84 are fixed to the lateral cases 12 and 13 by a fixing component 87.

Figure 2:
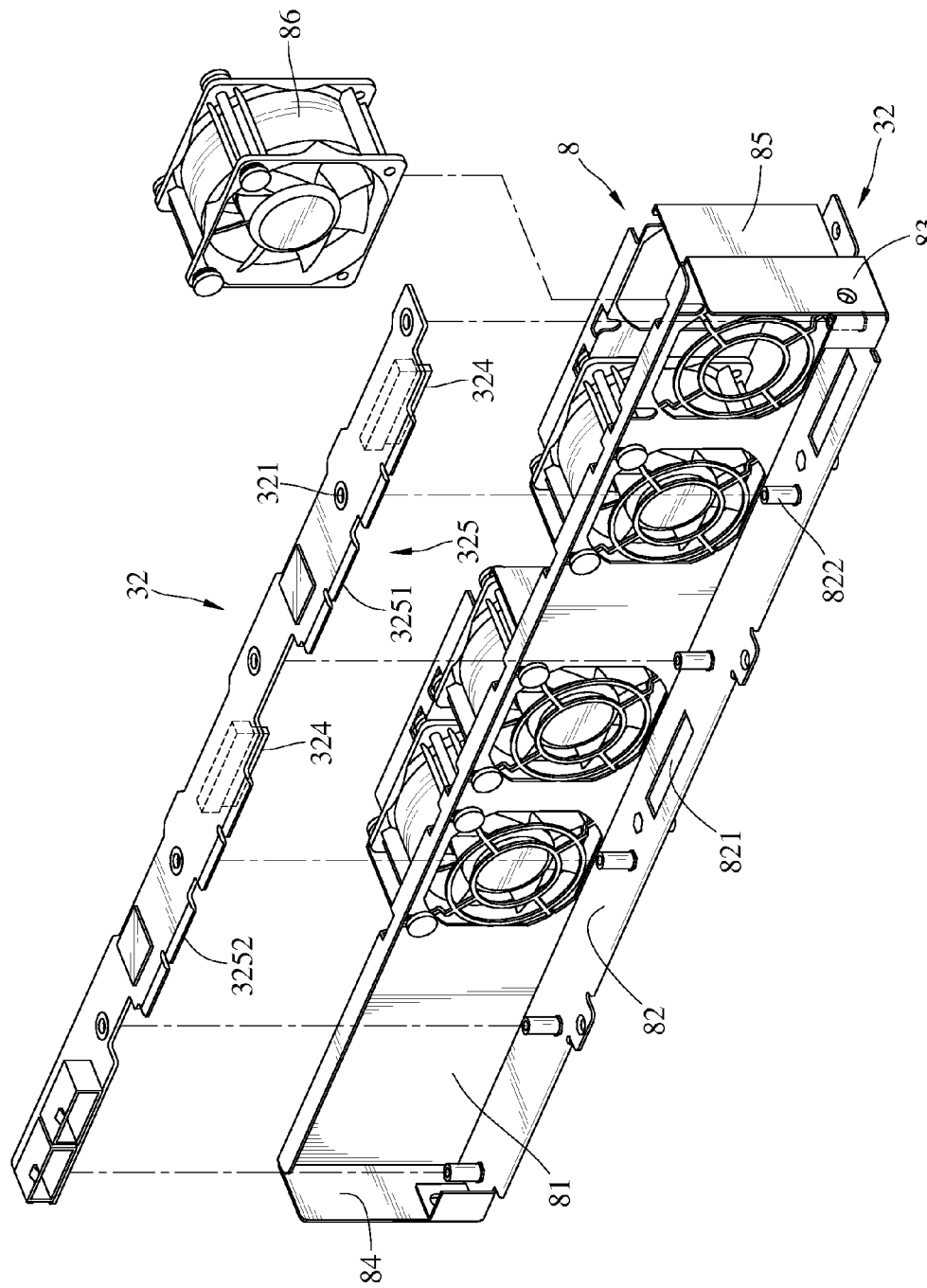
FIG. 2 is an exploded view of a second connecting board and a fan module according to the embodiment of the disclosure.

Please refer to FIG. 2 and FIG. 3. FIG. 2 is an exploded view of a second connecting board and a fan module according to the embodiment of the disclosure. In this and some embodiments, the second connecting board 32 of the connection module 3 is disposed on the bottom frame 82 of the fan module 8. The bottom frame 82 has at least one slot 821. The fourth set of connection ports 324 of the second connecting board 32 is connected to the third set of connection ports 313 through the slot 821 and electrically coupled to the first connecting board 31. Additionally, the bottom frame 82 comprises a plurality of locating posts 822. The second connecting board 32 comprises a plurality of locating holes 321. The locating posts 822 are corresponding to the locating holes 321. A screw (not shown in FIGs.) may penetrate through and be affixed to the locating posts 822 and the locating holes 321, so as to fix the second connecting board 32 to the fan module 8 securely.

In this and some embodiments, the tray 35 comprises a plurality of positioning posts 352. The first connecting board 31 comprises a plurality of holes 316. The positioning posts 352 are securely fixed to the mounting frame 85 of the fan module 8 by connections of the holes 316 of the first connecting board 31.

Please refer to FIG. 5. The storage module 2 comprises a plurality of storage units 21 and a back board 22. The back board 22 is disposed between and connected to the connection module 3 and the storage units 21. The storage module 2 is coupled to the connection module 3 via the back board 22. Additionally, the back board 22 comprises a connector 221. The first set of connection ports 311 of the connection module 3 is electrically connected to the connector 221 of the back board 22 of the storage module 2. Accordingly, the storage units 21 may access data from the first expander board 4, the second expander board 5, the first mother board 6 and the second mother board 7.

The first expander board 4 and the second expander board 5 will be described as follows. Please refer to FIG. 4, which is an exploded view of the case, a first mother board, a second mother board, a first expander board and a second expander board according to the embodiment of the disclosure. In this and some embodiments, the first expander board 4 comprises a first main expander board 41, a first auxiliary expander board 42, a wire 44, a connector 45 and a bottom plate 46. The first main expander board 41 and the first auxiliary expander board 42 are disposed on the bottom plate 46. Two ends opposite to each other of the first main expander board 41 is coupled to the first expander board connection port 3121 of the second set of connection ports 312 of the connection module 3 and the first auxiliary expander board 42, respectively. Additionally, the first expander board 4 comprises at least one first expander chip 43 disposed on the first main expander board 41. A distance is formed between the first main expander board 41 and the first auxiliary expander board 42. The first main expander board 41 is electrically coupled to the first auxiliary expander board 42 via the wire 44. Accordingly, other electrical components may be connected or plugged with a connection port 47 of the first auxiliary expander board 42, so as to expand the functions of the server 1000. The other electrical components may be, but not limited to, a storage group of supporting Just a Bunch Of Disks (JBOD) or a memory.

Similar to the first expander board 4, the second expander board 5 comprises a second main expander board 51, a second auxiliary expander board 52, a wire 54, a connector 55 and a bottom plate 56. The second main expander board 51 and the second auxiliary expander board 52 are disposed on the bottom plate 56. Two ends opposite to each other of the second main expander board 51 is coupled to the second expander board connection port 3122 of the second set of connection ports 312 of the connection module 3 and the second auxiliary expander board 52, respectively. Additionally, the second expander board 5 comprises at least one second expander chip 53 disposed on the second main expander board 51. A distance is formed between the second main expander board 51 and the second auxiliary expander board 52. The second main expander board 51 is electrically coupled to the second auxiliary expander board 52 via the wire 54. Accordingly, other electrical components may be connected or plugged with a connection port 57 of the second auxiliary expander board 52, so as to expand the functions of the server 1000.

The first mother board 6 and the second mother board 7 will be described as follows. Please refer to FIG. 4 again. The first mother board 6 is disposed on a bottom plate 63. The first mother board 6 comprises at least one first central processing unit 61, a connector 62 and a plurality of electronic modules 64. The first mother board 6 is coupled to a first mother board connection port 3251 of the fifth set of connection port 325 of the second connecting board 32 to access data via the connector 62. Additionally, the second mother board 7 is disposed on a bottom plate 73. The second mother board 7 comprises at least one second central processing unit 71, a connector 72 and a plurality of electronic modules 74. The second mother board 7 is coupled to a second mother board connection port 3252 of the fifth set of connection port 325 of the second connecting board 32 to access data via the connector 72.

Furthermore, the first mother board 6 and the second mother board 7 may comprise expander cards (such as PCIe cards). The electronic modules 64, 74 may be storage devices (such as Solid State Disk drives (SSD) or general hard disk drives). Accordingly, the functions of the first mother board 6 and the second mother board 7 may be expanded. Additionally, the first expander board 4, the second expander board 5, the first mother board 6 and the second mother board 7 may be, but not limited to, coupled to the connection module 3 via the connectors 45, 55, 62, 72 respectively. In other embodiments, the connection module 3 may be plugged with the first expander board 4, the second expander board 5, the first mother board 6 and the second mother board 7, directly.

The configurations of a server 1000 will be described as follows. Please refer to FIG. 2. The pluggable fans 86 may be disposed between the main frame 81 and the mounting frame 85. The second connecting board 32 of the connection module 3 is affixed to the bottom frame 82 of the fan module 8. Similarly, a screw (not shown in FIGs.) may penetrate through and affixed to the locating posts 822 and the locating holes 321, to fix the second connecting board 32 to the fan module 8 securely.

Please refer to FIG. 3. The tray 35 comprises a plurality of fixing posts 351. First, the first connecting board 31 of the connection module 3 is aligned with the fixing posts 351 of the tray 35 through the key-shaped holes 314 and the positioning holes 315, then the first set of connection ports 311 of the first connecting board 31 is adapted to plug with the connector 221 of the back board 22. The fixing posts 351 are fixed through the key-shaped holes 314 and the positioning holes 315. Furthermore, the third set of connection ports 313 is plugged with the fourth set of connection ports 324 of the second connecting board 32 through the slot 821 of the bottom frame 82 of the fan module 8. At the same time, the positioning posts 352 of the tray 35 are fixed to the fan module 8 by connections of the positioning posts 352 and the holes 316 of the first connecting board 31. However, the fixing ways of the first connecting board 31 and the second connecting board 32 are not limiting the disclosure. Additionally, the side frames 83 and 84 of the fan module 8 are fixed to the fixation holes 121, 131 of the lateral cases 12 and 13 by the fixing component 87. The power module 9 is electrically connected to the first connecting board 31 and the second connecting board 32. In other words, the connection module 3 is assembled with the case 1.

Figure 4:
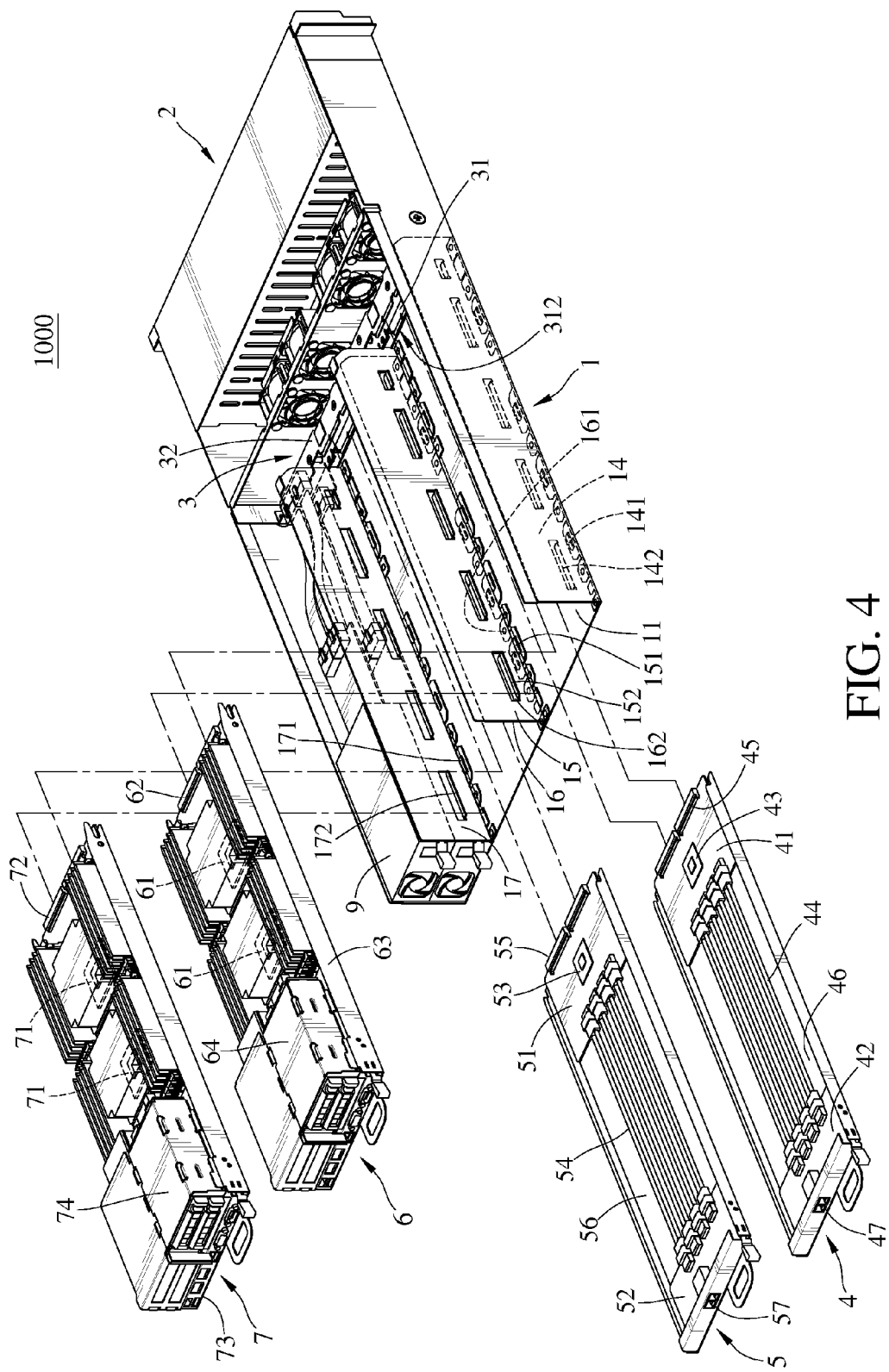
FIG. 4 is an exploded view of the case, a first mother board, a second mother board, a first expander board and a second expander board according to the embodiment of the disclosure.

Please refer to FIG. 4. The first expander board 4, which enters the case 1 along the straight tracks 141 and 142 of the partitions 14 and 15, is coupled to the first expander board connection port 3121 of the second set of connection ports 312 of the first connecting board 31. The first mother board 6, which enters the case 1 along the straight tracks 142 and 152 of the partitions 14 and 15, is coupled to the first mother board connection port 3251 of the fifth set of connection port 325 of the second connecting board 32. The second expander board 5, which enters the case 1 along the straight tracks 161 and 171 of the partitions 16 and 17, is coupled to the second expander board connection port 3122 of the second set of connection ports 312 of the first connecting board 31. The second mother board 7, which enters the case 1 along the straight tracks 162 and 172 of the partitions 16 and 17, is coupled to the second mother board connection port 3252 of the fifth set of connection port 325 of the second connecting board 32. Accordingly, the first expander board 4, the second expander board 5, the first mother board 6 and the second mother board 7 are connected to the connection module 3 pluggably and respectively.

In this and some embodiments, the storage module 2 is coupled to the first expander board 4, the second expander board 5, the first mother board 6 and the second mother board 7 via the connection module 3. When either the first expander board 4 or the second expander board 5 operates in a normal state (i.e., being operating normally) and either the first mother board 6 or the second mother board 7 operates in the normal state, either the first mother board 6 or the second mother board 7 is adapted to access data from all the storage units 21 of the storage module 2 by a route of either the first expander board 4 or the second expander board 5 operating in the normal state.

In this and some embodiments, the first mother board 6, the second mother board 7, the first expander board 4 and the second expander board 5 are connected to the connection module 3 and disposed in the case 1 independently and pluggably. When the first mother board 6, the second mother board 7, the first expander board 4 and the second expander board 5 operate in a normal state, any one of the first mother board 6 and the second mother board 7, or any one of the first expander board 4 and the second expander board 5 which operates in the normal state is capable of being replaced without shutting down the server 1000.

Figure 6:
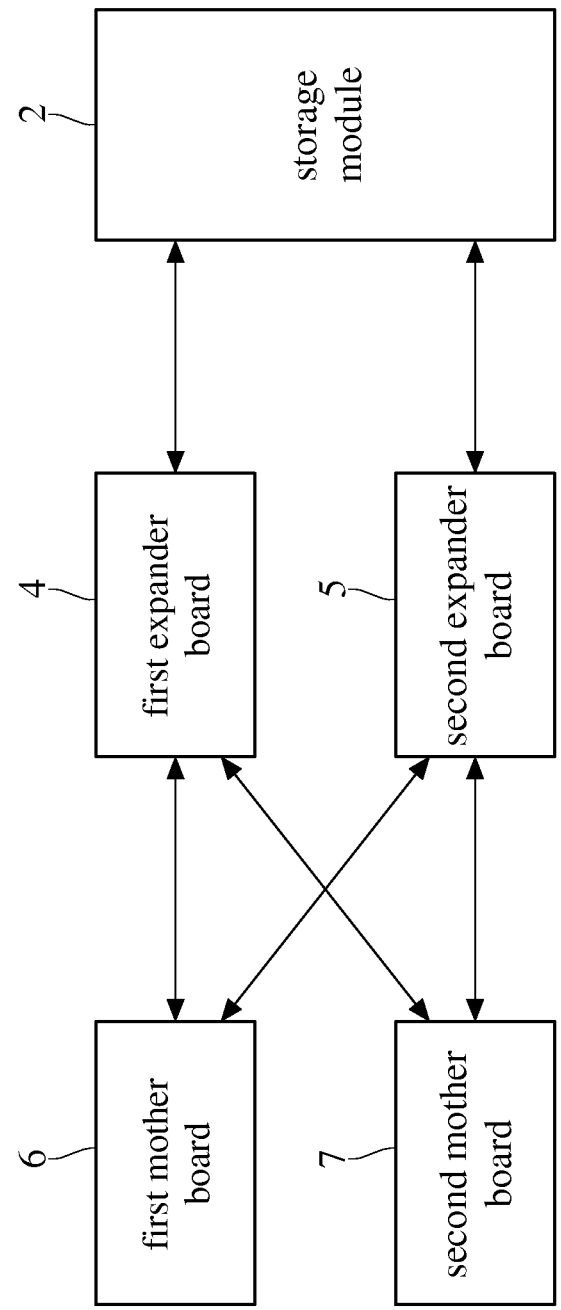
FIG. 6 is a block diagram of a storage module, the first mother board, the second mother board, the first expander board and the second expander board according to the embodiment of the disclosure.
Figure 7:
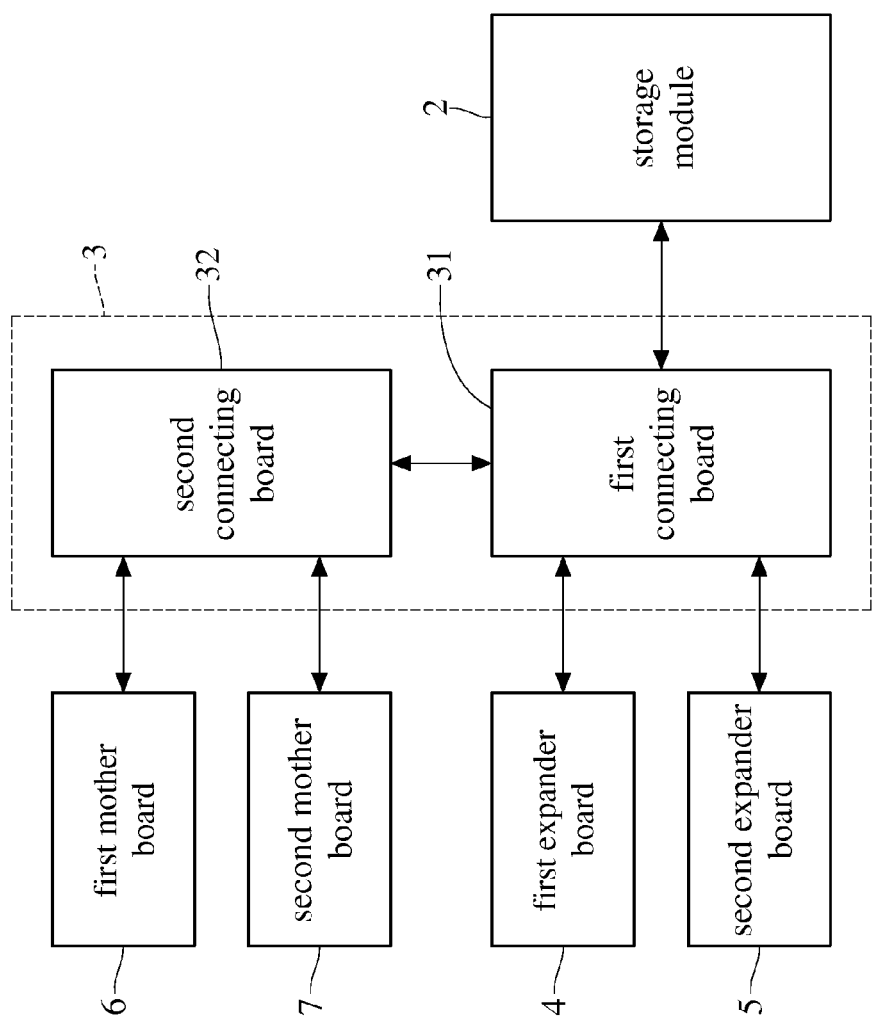
FIG. 7 is a block diagram of the storage module, a first connecting board, the second connecting board, the first mother board, the second mother board, the first expander board and the second expander board according to the embodiment of the disclosure.

The special effects achieved by the server 1000 will be described as follows. Please refer to FIG. 6 to FIG. 11. FIG. 6 is a block diagram of a storage module, the first mother board, the second mother board, the first expander board and the second expander board according to the embodiment of the disclosure. FIG. 7 is a block diagram of the storage module, the first connecting board, the second connecting board, the first mother board, the second mother board, the first expander board and the second expander board according to the embodiment of the disclosure. According to FIG. 6, when the first mother board 6 processes the data from the storage module 2, access commands are generated and transmitted to the storage module 2 via the first expander board 4. However, the first mother board 6 may transmit the access commands to the storage module 2 via the second expander board 5 when necessary (for example, when first expander board 4 is busy, or when there are excessive access commands). Similarly, the second mother board 7 may also be adapted to transmit the access commands to the storage module 2 via the second expander board 5. When necessary, the second mother board 7 may transmit the access commands to the storage module 2 via the first expander board 4.

Additionally, one or more first devices (such as the first expander chip 43) of the first expander board 4 may be, but not limited to, controlled by the first central processing unit 61 of the first mother board 6. One or more second devices (such as the second expander chip 53) of the second expander board 5 may be, but not limited to, controlled by the second central processing unit 71 of the second mother board 7. When necessary, the first device of the first expander board 4 may be controlled by the second central processing unit 71 of the second mother board 7. Similarly, the second device of the second expander board 5 may be controlled by the first central processing unit 61 of the first mother board 6.

The applications of the first connecting board 31 and the second connecting board 32 are described in FIG. 7. Practically, when the first mother board 6 transmits a first command to the storage module 2, the first command is generally transmitted to the first expander board 4 via the second connecting board 32 and the first connecting board 31. The first expander chip 43 disposed on the first expander board 4 is adapted to determine whether the first command is a command to be transmitted to the storage module 2. If the first command is the command to be transmitted to the storage module 2, the first expander board 4 transmits the first command to the storage module 2 via the first connecting board 31. However, the first command may be transmitted to the second expander board 5 rather than the first expander board 4. The way of determination and operation of the second expander board 5 are the same as the first expander board 4.

Similarly, when the second mother board 7 transmits a second command to the storage module 2, the second command is generally transmitted to the second expander board 5 via the second connecting board 32 and the first connecting board 31. The second expander chip 53 disposed on the second expander board 5 is adapted to determine whether the second command is a command to be transmitted to the storage module 2. If the first command is the command to be transmitted to the storage module 2, the second expander board 5 may transmit the second command to the storage module 2 via the first connecting board 31. However, the second command may be transmitted to the first expander board 4 rather than the second expander board 5. The way of determination and operation of the first expander board 4 are the same as the second expander board 5.

Figure 8:
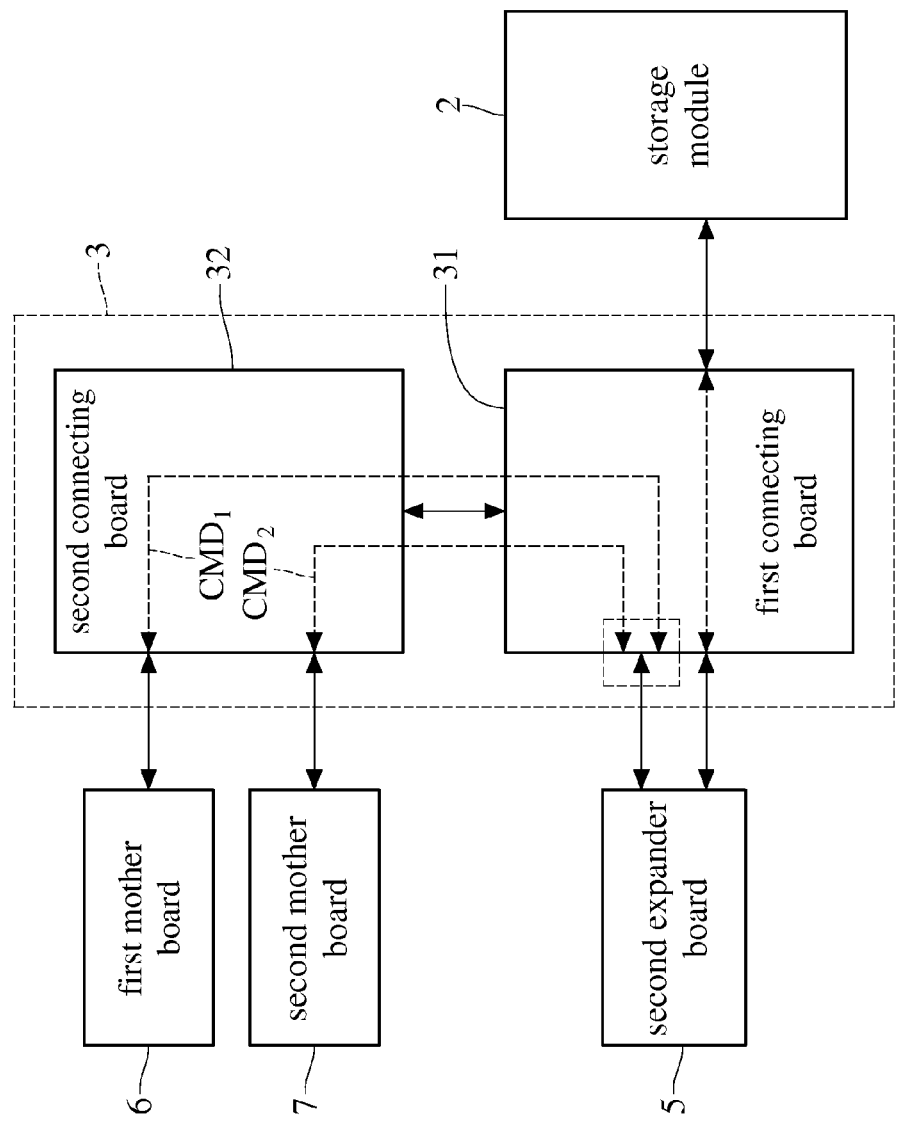
FIG. 8 is a functional block diagram according to the embodiment in FIG. 7 when the first expander board is removed.

Please refer to FIG. 8, which is a functional block diagram according to the embodiment in FIG. 7 when the first expander board is removed. As shown in FIG. 8, in practice, the first expander board 4 in FIG. 7 may be removed when the first expander board 4 is repaired or shut down. The storage module 2, the first connecting board 31 and the second connecting board 32 of the connection module 3, the second expander board 5, the first mother board 6 and the second mother board 7 both remain. When the first mother board 6 needs to access the data from the storage module 2, because the first expander board 4 have been removed, the first mother board 6 may transmit the access commands to the second expander board 5 through a signal route CMD1, the second connecting board 32 and the first connecting board 31. Then, the second expander board 5 (or the second expander chip 53 of the second expander board 5) is adapted to transmit the access commands to the storage module 2 through the signal route CMD1. When the second mother board 7 is adapted to access data from the storage module 2, the second mother board 7 may transmit the access commands to the storage module 2 through the signal route CMD2. In other words, the functions of the first mother board 6 may not be affected after the first expander board 4 is removed since the transmission function of the first expander board 4 may be replaced by the second expander board 5.

Figure 9:
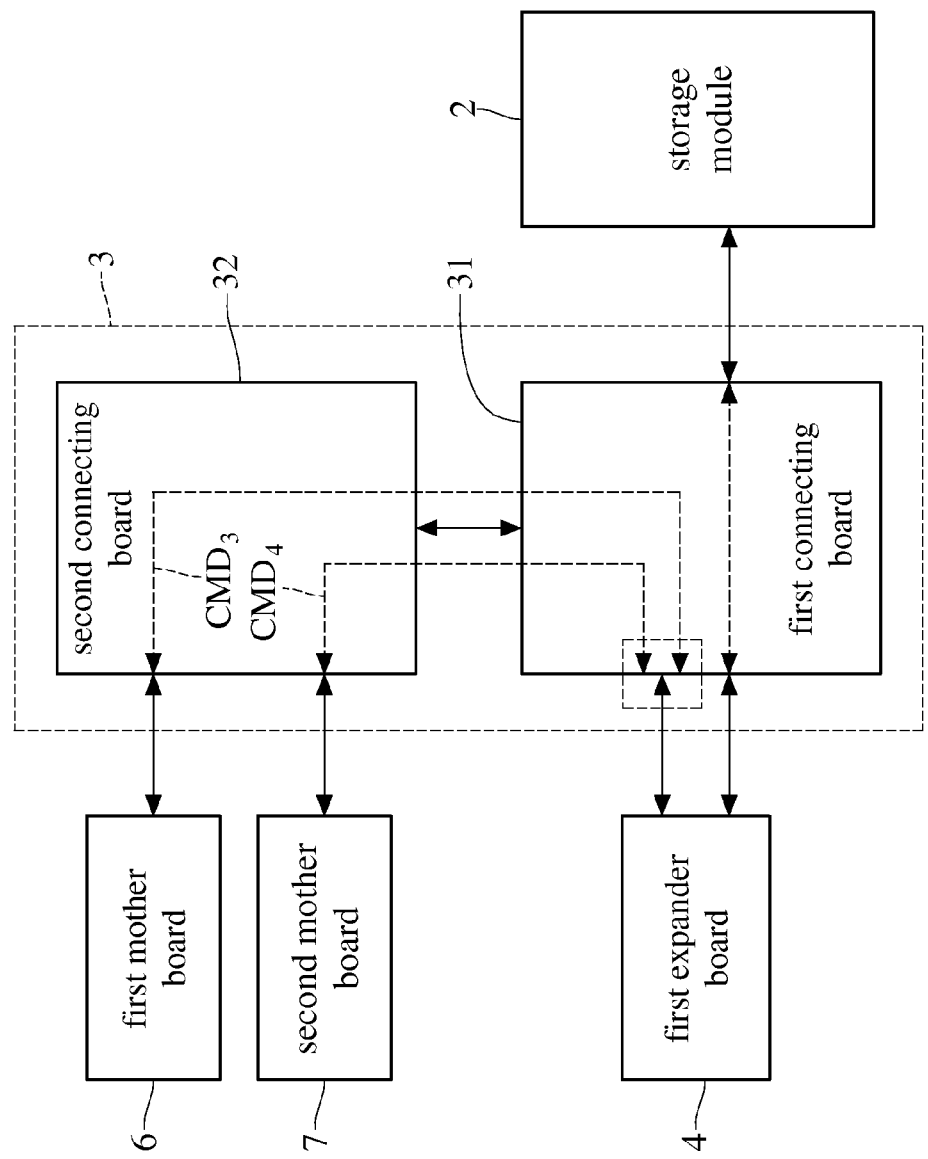
FIG. 9 is a functional block diagram according to the embodiment in FIG. 7 when the second expander board is removed.

Similarly, please refer to FIG. 9, which is a functional block diagram according to the embodiment in FIG. 7 when the second expander board is removed. As shown in FIG. 9, in practice, the second expander board 5 in FIG. 7 may be removed when the second expander board 5 is repaired or shut down. The storage module 2, the first connecting board 31 and the second connecting board 32 of the connection module 3, the first expander board 4, the first mother board 6 and the second mother board 7 both remain. When the first mother board 6 needs to access the data from the storage module 2, because the second expander board 5 has been removed, the first mother board 6 may transmit the access commands to the first expander board 4 through a signal route CMD3, the second connecting board 32 and the first connecting board 31. Then, the first expander board 4 (or the first expander chip 43 of the first expander board 4) may transmit the access commands to the storage module 2 through the signal route CMD3. When the second mother board 7 needs to access the data from the storage module 2, the second mother board 7 may transmit the access commands to the storage module 2 through the signal route CMD3. In other words, the functions of the first mother board 6 may not be affected without the first expander board 4. Additionally, when the second mother board 7 is adapted to access the data from the storage module 2, because the second expander board 5 is removed, the second mother board 7 is adapted to transmit the access commands to the first expander board 4 through a signal route CMD4, the second connecting board 32 and the first connecting board 31. Then, the first expander board 4 (or the first expander chip 43 of the first expander board 4) is adapted to transmit the access commands to the storage module 2 through the signal route CMD4. In other words, the functions of the second mother board 7 may not be affected after the second expander board 5 since the transmission function of the second expander board 5 may be replaced by the first expander board 4.

Figure 10:
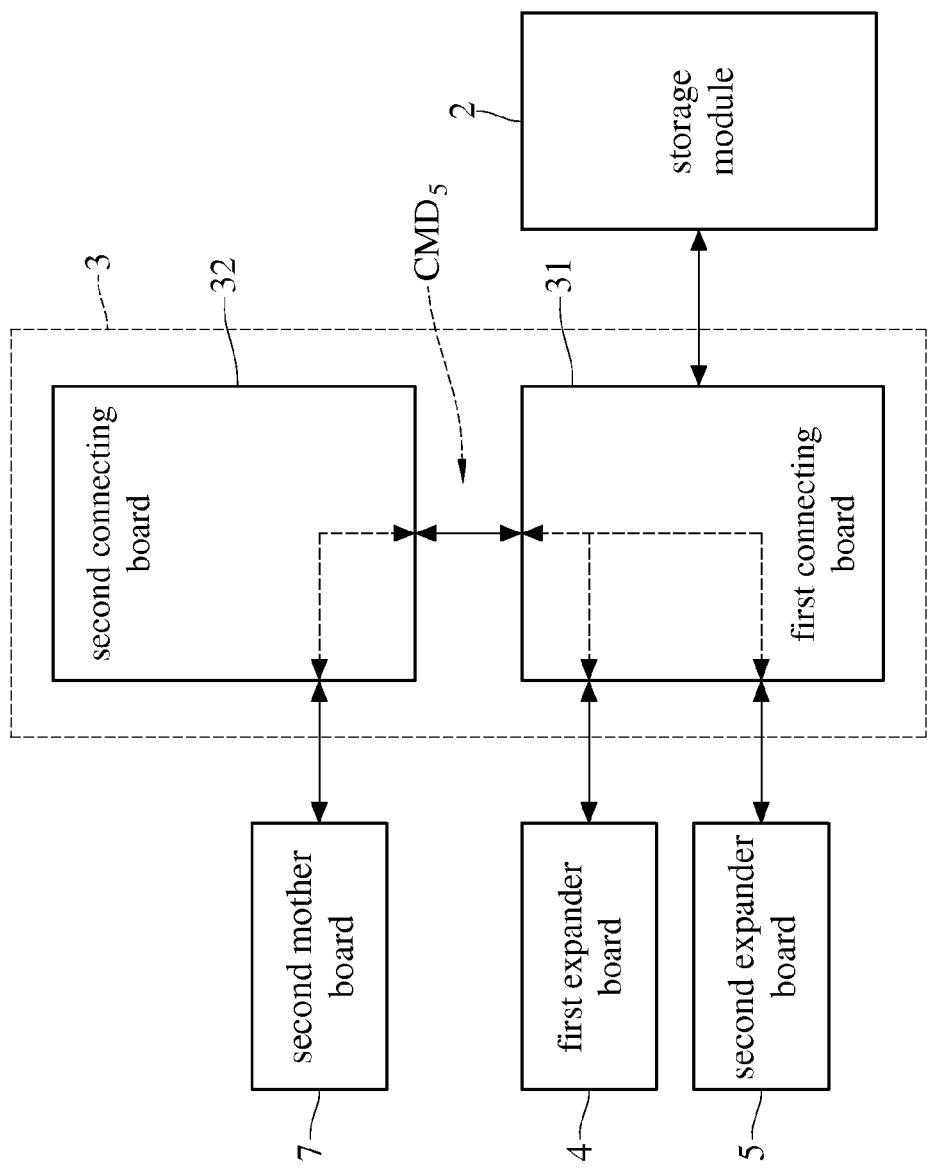
FIG. 10 is a functional block diagram according to the embodiment in FIG. 7 when the first mother board is removed.

Please refer to FIG. 10 which is a functional block diagram according to the embodiment in FIG. 7 when the first mother board is removed. As shown in FIG. 10, in practice, the first mother board 6 in FIG. 7 may be removed when the first mother board 6 is repaired or shut down. The storage module 2, the first connecting board 31 and the second connecting board 32 of the connection module 3, the first expander board 4, the second expander board 5 and the second mother board 7 both remain. At the time, the devices of the first expander board 4 and the second expander board 5 (such as the first expander chip 43 and the second expander chip 53) are controlled by controlling devices of the second mother board 7. For example, a signal route CMD5 may be formed between the first expander board 4 and the second mother board 7, so that the first device of the first expander board 4 and the second device of the second expander board 5 may be controlled by a processing unit of the first mother board 6. In other words, the functions of the first expander board 4 may not be affected after the first mother board 6 is removed since the transmission function of the first mother board 6 may be replaced by the second mother board 7.

Figure 11:
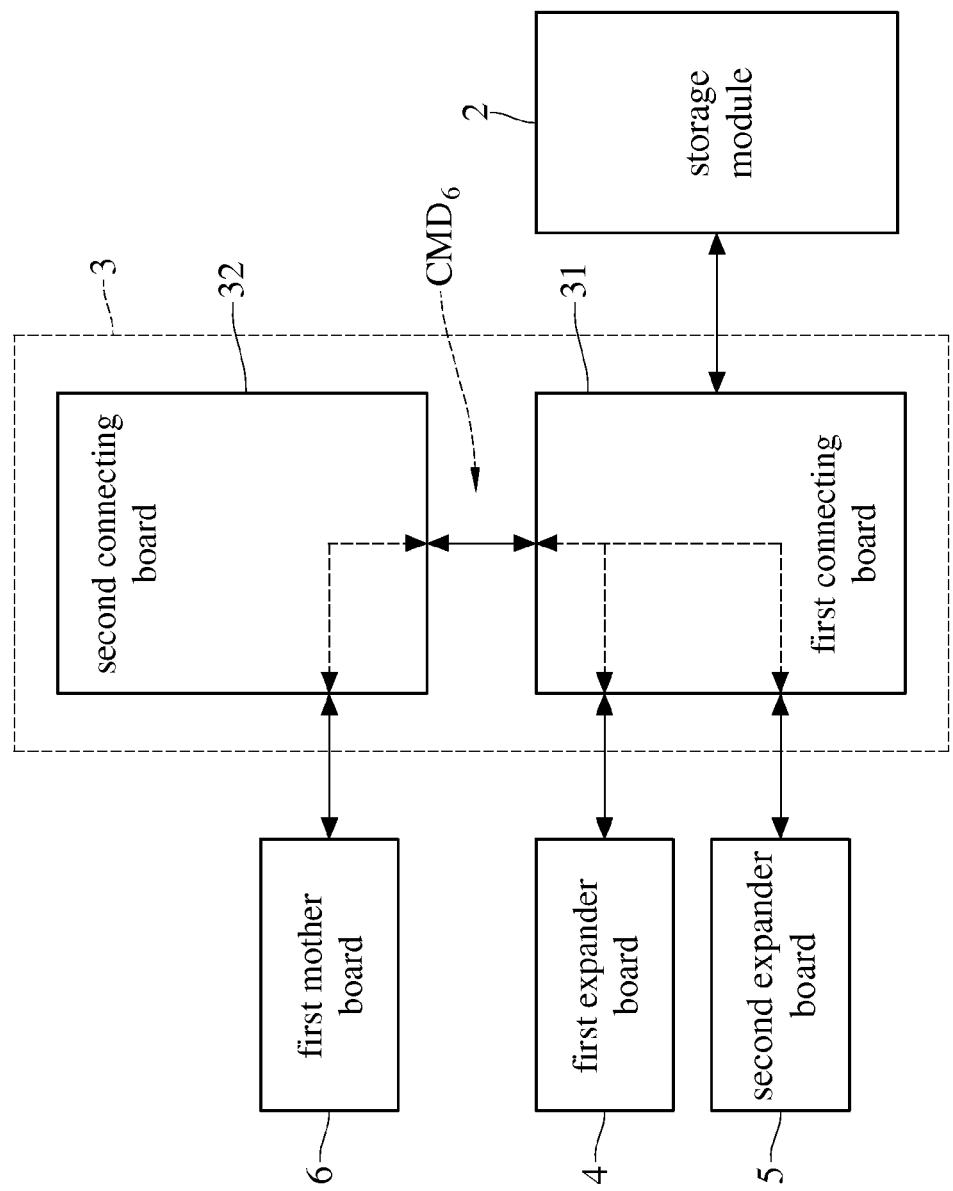
FIG. 11 is a functional block diagram according to the embodiment in FIG. 7 when the second mother board is removed.

Please refer to FIG. 11 which is a functional block diagram according to the embodiment in FIG. 7 when the second mother board is removed. As shown in FIG. 11, in practice, the second mother board 7 in FIG. 7 may be removed when the second mother board 7 is repaired or shut down. The storage module 2, the first connecting board 31 and the second connecting board 32 of the connection module 3, the first expander board 4, the second expander board 5 and the first mother board 6 both remain. At the time, the devices of the first expander board 4 and the second expander board 5 (such as the first expander chip 43 and the second expander chip 53) are controlled by a processing unit of the first mother board 6. For example, a signal route CMD6 may be formed between the second expander board 5 and the first mother board 6, so that the first device of the first expander board 4 and the second device of the second expander board 5 may be controlled by the processing units of the first mother board 6. In other words, the functions of the second expander board 5 may not be affected after the second mother board 7 is removed since the transmission function of the second mother board 7 may be replaced by the first mother board 6.

To sum up, according to the server of the disclosure, the first expander board, the second expander board, the first mother board and the second mother board are pluggably connected to the connection module, thereby improving the efficiency of the assembly and disassembly, stability and reliability of the operation.

In some embodiments, when either the first expander board or the second expander board operates in a normal state and either the first mother board or the second mother board operates in the normal state, either the first mother board or the second mother board is adapted to access the data from the storage module by an route of either the first expander board or the second expander board which operates in the normal state. When the first mother board, the second mother board, the first expander board and the second expander board all operate in the normal state, any one of the first mother board and the second mother board, or any one of the first expander board and the second expander board which operates in the normal state is capable of being replaced without shutting down the server.

Because the configurations of the first expander board and the second expander board, and the configurations of the first mother board and the second mother board become redundant designs mutually, when any mother board or the expander board fails, it may be replaced by other mother boards or expander boards without shutting down the server. Additionally, since the first mother board, the second mother board, the first expander board and the second expander board are pluggable, the server may be replaced without being shut down, thereby improving the efficiency of the assembly and disassembly, stability and reliability of the operation.

The disclosure will become more fully understood from the said embodiment for illustration only and thus does not limit the disclosure. Any modifications within the spirit and category of the disclosure fall in the scope of the disclosure.

What is claimed is:

1. A server, comprising: a case comprising a bottom case; a storage module disposed on the bottom case and comprising a plurality of storage units are disposed on the storage module; a connection module disposed on the bottom case and connected to the storage module; a first expander board, wherein at least one first expander chip is disposed on the first expander board; a second expander board, wherein at least one second expander chip is disposed on the second expander board; a first mother board, wherein at least one first central processing unit is disposed on the first mother board; and a second mother board, wherein at least one second central processing unit is disposed on the second mother board; wherein the first expander board, the second expander board, the first mother board and the second mother board are pluggably connected to the connection module, respectively; wherein the connection module comprises a first connecting board and a second connecting board which are connected to each other, the first connecting board is located between the second connecting board and the bottom case, and the first connecting board comprises: a first set of connection ports connected and electrically coupled to the storage module; a second set of connection ports electrically coupled to the first set of connection ports, for being connected to the first expander board, the second expander board or the first mother board, the second mother board to access data; and a third set of connection ports electrically coupled to the first set of connection ports and the second set of connection ports, for being connected to the second connecting board; wherein the second connecting board comprises: a fourth set of connection ports electrically coupled to the first connecting board via the third set of connection ports; and a fifth set of connection ports coupled to the fourth set of connection ports, for being connected to the first mother board, the second mother board or the first expander board, the second expander board to access data.

2. The server according to claim 1, wherein the connection module has a first side and a second side which are opposite to each other, the storage module is connected to the first side of the connection module, and the first expander board, the second expander board, the first mother board and the second mother board are connected to the second side of the connection module, respectively.

3. The server according to claim 1, wherein the storage module comprises a back board disposed between the connection module and the plurality of storage units, the back board is connected to the connection module and the plurality of storage units, and the storage module is coupled to the connection module through the back board.

4. The server according to claim 1, wherein the connection module further comprises a tray disposed on the bottom case, the tray comprises a plurality of fixing posts, the first connecting board comprises a plurality of key-shaped holes and a plurality of positioning holes, and the first connecting board is assembled with the tray by connections of the plurality of key-shaped holes and the fixing posts and connections of the positioning holes and the other fixing posts.

5. The server according to claim 1, further comprising a fan module disposed between the storage module and the first expander board, the second expander board, the first mother board, the second mother board, wherein the fan module comprises a main frame, a bottom frame, two side frames and at least one mounting frame, the bottom frame and the two side frames are connected to three ends of the main frame respectively and extend toward the first expander board, the second expander board, the first mother board and the second mother board respectively, the mounting frame connected to the main frame extends toward the storage module, and the mounting frame is adapted to accommodate at least one pluggable fan.

6. The server according to claim 5, wherein the second connecting board is disposed on the bottom frame, the bottom frame has at least one slot, the fourth set of connection ports of the second connecting board is connected to the third set of connection ports through the slot and electrically coupled to the first connecting board.

7. The server according to claim 5, wherein the case further comprises two lateral cases, and the two side frames are fixed to the two lateral cases by at least one fixing component, respectively.

8. The server according to claim 1, further comprising a power module, wherein the power module is disposed next to the first expander board and the first mother board, or disposed next to the second expander board and the second mother board, and the power module being connected to the connection module.

9. The server according to claim 1, wherein the first expander board comprise a first main expander board and a first auxiliary expander board, the first main expander board is coupled to the connection module and the first auxiliary expander board, the second expander board comprises a second main expander board and a second auxiliary expander board, and the second main expander board is coupled to the connection module and the second auxiliary expander board.

10. The server according to claim 1, wherein the case comprises a plurality of partitions erected on the bottom case, each partition has two straight tracks with heights which are different from each other, and the first expander board, the second expander board, the first mother board and the second mother board are capable of being guided by the plurality of straight tracks of the plurality of partitions so as to be connected to the connection module pluggably.

11. The server according to claim 1, wherein storage module is coupled to the first expander board, the second expander board, the first mother board and the second mother board via the connection module, when either the first expander board or the second expander board operates in a normal state and either the first mother board or the second mother board operates in the normal state, either the first mother board or the second mother board is adapted to access the data from all the plurality of storage units of the storage module by a route of either the first expander board or the second expander board which operates in the normal state.

12. The server according to claim 1, wherein the first mother board, the second mother board, the first expander board and the second expander board are disposed in the case independently, and when the first mother board, the second mother board, the first expander board and the second expander board operate in a normal state, any one of the first mother board and the second mother board, or any one of the first expander board and the second expander board which operates in the normal state is capable of being replaced without shutting down the server.

* * * * *